US012690225B2

(12) United States Patent
Kim et al.

(10) Patent No.: US 12,690,225 B2
(45) Date of Patent: Jul. 21, 2026

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventors: Jong Min Kim, Seoul (KR); Geum Ho Ahn, Seoul (KR)

(73) Assignee: DB HiTek Co., Ltd., Bucheon-si (KR)

( * ) Notice: Subject to any disclaimer, the term of this patent is extended or adjusted under 35 U.S.C. 154(b) by 472 days.

(21) Appl. No.: 18/311,102

(22) Filed: May 2, 2023

(65) Prior Publication Data

US 2024/0250168 A1    Jul. 25, 2024

(30) Foreign Application Priority Data

Jan. 25, 2023    (KR) ........................ 10-2023-0009484

(51) Int. Cl.
| | |
|---|---|
| *H10D 30/65* | (2025.01) |
| *H10D 30/01* | (2025.01) |
| *H10D 30/68* | (2025.01) |
| *H10D 64/00* | (2025.01) |

(52) U.S. Cl.
CPC ......... *H10D 30/65* (2025.01); *H10D 30/0281* (2025.01); *H10D 30/6891* (2025.01); *H10D 64/112* (2025.01)

(58) Field of Classification Search
CPC ............. H10D 30/6891; H10D 64/112; H10D 30/603; H10D 64/111; H10D 64/516; H10D 62/10; H10D 62/393; H10D 30/65–659; H10D 30/0281–0289; H10D 30/68–689; H10D 30/0411; H10B 41/00–70
See application file for complete search history.

(56) References Cited

U.S. PATENT DOCUMENTS

| | | | |
|---|---|---|---|
| 8,754,474 B2 | 6/2014 | Ko | |
| 2012/0126322 A1 | 5/2012 | Ko | |
| 2020/0335623 A1* | 10/2020 | Shin | ...................... H10D 62/153 |
| 2023/0061900 A1* | 3/2023 | Wu | ...................... H10D 62/156 |
| 2024/0006530 A1* | 1/2024 | Tai | ......................... H10D 30/65 |
| 2024/0234522 A1* | 7/2024 | Shin | ..................... H10D 30/603 |

FOREIGN PATENT DOCUMENTS

| | | |
|---|---|---|
| CN | 103579313 A | 2/2014 |
| KR | 10-2012-0055139 A | 5/2012 |

* cited by examiner

*Primary Examiner* — Shahed Ahmed
(74) *Attorney, Agent, or Firm* — Central California IP Group, P.C.; Andrew D. Fortney

(57) ABSTRACT

Disclosed is a high voltage semiconductor device and a method of manufacturing the same and, more particularly, a high voltage semiconductor device and a method of manufacturing the same enabling more effective integration through improvement of breakdown voltage (BV) characteristics during device turn-on and/or turn-off and consequent improvement of specific on-resistance (Rsp) characteristics by forming or including a floating gate and/or a connection structure on a substrate, between a gate electrode and a drain.

20 Claims, 15 Drawing Sheets

HIGH VOLTAGE SEMICONDUCTOR DEVICE AND METHOD OF MANUFACTURING SAME

CROSS REFERENCE TO RELATED APPLICATION

The present application claims priority to Korean Patent Application No. 10-2023-0009484, filed Jan. 25, 2023, the entire contents of which are incorporated herein for all purposes by this reference.

BACKGROUND OF THE INVENTION

Field of the Invention

The present disclosure relates to a high voltage semiconductor device and a method of manufacturing the same and, more particularly, to a high voltage semiconductor device and a method of manufacturing the same enabling more effective integration through improvement of breakdown voltage (BV) characteristics during device turn-on and/or turn-off and consequent improvement of specific on-resistance (Rsp) characteristics by forming or including a floating gate and/or a connection structure between a gate electrode and a drain.

Description of the Related Art

A lateral double-diffused metal oxide semiconductor (LD-MOS) is a representative power device with fast switching response and high input impedance. Hereinafter, the structure and manufacturing process of a typical LDMOS device will be described in detail.

FIG. 1 is a cross-sectional view of a conventional high voltage semiconductor device.

Referring to FIG. 1, a conventional high voltage semiconductor device 9 includes a gate electrode 910 on a substrate 901; a field plate 930 on the gate electrode 910; a drain 950 at the surface of the substrate 901; and a drift region 970 surrounding the drain 950. The semiconductor device 9 further includes a source 990 at the surface of the substrate 901; and a body region 991 below or surrounding the source 990.

In the conventional high voltage semiconductor device 9, a reduced surface field (RESURF) structure may include the field plate 930 and the gate electrode 910. When an electric field concentrates in an area E1 of the drift region 970 below and/or adjacent to an edge of the gate electrode 910 or in an area E2 of the drift region 970 below and/or adjacent to an edge E2 of the field plate 930 near the drain 950, the breakdown voltage (BV) inevitably deteriorates during device turn-off. Moreover, when the device is turned on, charge carriers increase in the drift region 970 and the electric field concentrates on or near an edge or corner of the drain 950. As a result, even at a low drain voltage, impact ionization increases, and the breakdown voltage inevitably deteriorates.

To solve the above-mentioned problems, the present inventors conceived a high voltage semiconductor device having a novel structure and a method for manufacturing the same, and the details will be described later.

DOCUMENTS OF RELATED ART

Korean Patent Application Publication No. 10-2012-0055139, entitled "LDMOS SEMICONDUCTOR DEVICE."

SUMMARY OF THE INVENTION

The present disclosure has been made to solve the problems of the related art, and an objective of the present disclosure is to provide a high voltage semiconductor device and a method of manufacturing the same, which enable miniaturization of overall device size through improvement of breakdown voltage (BV) characteristics during turn-on and/or turn-off and consequent improvement of specific on-resistance (Rsp) characteristics by forming or including a floating gate and/or a connection structure between a gate electrode and a drain.

In addition, an objective of the present disclosure is to provide a high voltage semiconductor device and a method of manufacturing the same capable of appropriately controlling electric field distribution at a substrate interface by controlling the distance and degree of overlap between the floating gate and a field plate.

In addition, an objective of the present disclosure is to provide a high voltage semiconductor device and a method of manufacturing the same, which improve process efficiency without requiring an additional process by forming the floating gate substantially simultaneously with the gate electrode (e.g., in the same deposition, patterning and/or etching processes).

Furthermore, an objective of the present disclosure is to provide a high voltage semiconductor device and a method of manufacturing the same, which further improve the breakdown voltage characteristics during device turn-off by forming or including a plurality of floating gates between the gate electrode and the drain.

In addition, an objective of the present disclosure is to provide a high voltage semiconductor device and a method of manufacturing the same capable of structural simplification by forming or including floating gates having the same height and the same substantially uniform thickness as the gate electrode.

In addition, an objective of the present disclosure is to provide a high voltage semiconductor device and a method of manufacturing the same, which improve process efficiency without requiring an additional process by forming the connection structure substantially simultaneously with the gate electrode or field plate (e.g., in the same deposition, patterning and/or etching process).

Moreover, an objective of the present disclosure is to provide a high voltage semiconductor device and a method of manufacturing the same, which further improve the breakdown voltage characteristics of the device by forming or including a plurality of field plates spaced apart from each other on a substrate.

Furthermore, an objective of the present disclosure is to provide a high voltage semiconductor device and a method of manufacturing the same capable of improving process efficiency by forming or including a deep well using the same mask pattern as a drift region.

According to one or more embodiments of the present disclosure, there is provided a high voltage semiconductor device including a substrate; a drift region on the substrate; a body region on the substrate; a drain in the drift region; a source in the body region; a gate insulating film on the substrate, and a gate electrode on the gate insulating film; an insulating pattern on the gate electrode and the substrate; a conductive field plate on the insulating pattern; and a floating gate on the substrate, the floating gate being between the gate electrode and the drain.

According to another embodiment of the present disclosure, the high voltage semiconductor device may further include a body contact adjacent to or in contact with the source.

According to still another embodiment of the present disclosure, the high voltage semiconductor device may further include a deep well under the drift region in the substrate; and a buried layer under the deep well in the substrate.

According to still another embodiment of the present disclosure, the high voltage semiconductor device of the present disclosure may include a plurality of the field plates, physically spaced apart from each other on the insulating pattern.

According to still another embodiment of the present disclosure, in the high voltage semiconductor device of the present disclosure, the floating gate may be substantially coplanar with the gate electrode.

According to still another embodiment of the present disclosure, in the high voltage semiconductor device of the present disclosure, the floating gate may have a substantially identical composition and a substantially identical height as the gate electrode.

According to still another embodiment of the present disclosure, the high voltage semiconductor device of the present disclosure may include a plurality of the floating gates, physically spaced apart from each other on the substrate and between the gate electrode and the drain.

According to still another embodiment of the present disclosure, the high voltage semiconductor device may further include an insulating spacer as on a sidewall of the floating gate.

According to still another embodiment of the present disclosure, a high voltage semiconductor device of the present disclosure includes a substrate; a drift region on the substrate; a body region on the substrate; a drain in the drift region; a source in the body region; a drain contact connecting the drain and a drain electrode; a source contact connecting the source and a source electrode; a gate insulating film on the substrate, and a gate electrode on the gate insulating film; an insulating pattern on the gate electrode and the substrate; a conductive field plate on the insulating pattern; and a connection structure connected to the drain contact.

According to still another embodiment of the present disclosure, in the high voltage semiconductor device of the present disclosure, the connection structure may have a substantially identical composition and a substantially identical height as the gate electrode.

According to still another embodiment of the present disclosure, in the high voltage semiconductor device of the present disclosure, the connection structure may have a substantially uniform thickness and may be substantially coplanar with the gate electrode.

According to still another embodiment of the present disclosure, in the high voltage semiconductor device of the present disclosure, the connection structure may have a substantially identical composition and a substantially identical height as the field plate.

According to still another embodiment of the present disclosure, the high voltage semiconductor device may further include at least one floating gate on the substrate, between the gate electrode and the connection structure.

According to still another embodiment of the present disclosure, in the high voltage semiconductor device of the present disclosure, the floating gate may have a substantially uniform thickness and is substantially coplanar with the gate electrode.

According to still another embodiment of the present disclosure, in the high voltage semiconductor device of the present disclosure, the floating gate may have a substantially identical composition and a substantially identical height as the gate electrode.

According to still another embodiment of the present disclosure, the high voltage semiconductor device may further include an insulating film between the floating gate and the substrate.

According to still another embodiment of the present disclosure, the high voltage semiconductor device of the present disclosure may include a plurality of the field plates, physically spaced apart from each other on the insulating pattern.

According to an embodiment of the present disclosure, there is provided a method of manufacturing a high voltage semiconductor device. The method includes forming a buried layer in a substrate; forming a deep well on the buried layer; forming a drift region and a body region on the substrate; forming a gate electrode on the substrate; forming a floating gate on the substrate, wherein the floating gate does not contact the gate electrode; forming a drain in the drift region; forming a source in the body region; and forming an interlayer insulating film on the substrate and the gate electrode.

According to another embodiment of the present disclosure, in the method of manufacturing a high voltage semiconductor device of the present disclosure, forming the gate electrode and forming the floating gate may include depositing a first conductive film on a first insulating film on the substrate; and etching the first conductive film using a mask pattern to form the gate electrode and the floating gate substantially simultaneously.

According to still another embodiment of the present disclosure, the method of manufacturing a high voltage semiconductor device of the present disclosure may further include forming a connection structure on the substrate, between the floating gate and the drain, and the connection structure may be formed substantially simultaneously with the gate electrode and the floating gate.

According to still another embodiment of the present disclosure, the method of manufacturing a high voltage semiconductor device may form a plurality of the floating gates, spaced apart from each other between the gate electrode and the drain.

According to still another embodiment of the present disclosure, the method of manufacturing a high voltage semiconductor device of the present disclosure may further include forming an insulating pattern on the substrate and the gate electrode; and forming a field plate on the insulating pattern.

According to still another embodiment of the present disclosure, the method of manufacturing a high voltage semiconductor device of the present disclosure may further include forming a connection structure on the substrate, between the floating gate and the drain, and the connection structure may be formed substantially simultaneously with the field plate.

The present disclosure has the following effects by the above configurations.

According to the present disclosure, by forming or including a floating gate and/or a connection structure between a gate electrode and a drain on a substrate, it is possible to reduce overall device size through improvement of breakdown voltage (BV) characteristics during turn-on and/or turn-off, thereby improving specific on-resistance (Rsp) characteristics (e.g., of the device).

In addition, according to the present disclosure, by controlling the distance and degree of overlap between the floating gate and a field plate, it is possible to appropriately control electric field distribution at a substrate interface (e.g., in the device).

In addition, according to the present disclosure, by forming the floating gate substantially simultaneously with the gate electrode (e.g., in the same deposition, patterning and/or etching processes), it is possible to improve process efficiency without requiring an additional process.

Furthermore, according to the present disclosure, by forming a plurality of floating gates between the gate electrode and the drain, it is possible to further improve the breakdown voltage characteristics during device turn-off.

In addition, according to the present disclosure, by ensuring that the floating gates have the same height and the same substantially uniform thickness as the gate electrode, it is possible to achieve structural simplification.

In addition, according to the present disclosure, by forming the connection structure substantially simultaneously with the gate electrode or field plate (e.g., in the same deposition, patterning and/or etching processes), it is possible to improve process efficiency without requiring an additional process.

Moreover, according to the present disclosure, by forming or including a plurality of field plates spaced apart from each other on or over the substrate, it is possible to further improve the breakdown voltage characteristics of the device.

Furthermore, according to the present disclosure, by forming a deep well using the same mask pattern as drift region, it is possible to improve process efficiency.

Meanwhile, it should be added that even if certain effects are not explicitly mentioned herein, the effects described in the following specification expected by the technical features of the present disclosure and their potential effects are treated as if they were described in the present specification.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are provided for reference in order to more completely explain the present disclosure to those of ordinary skill in the art.

Hereinafter, it should be noted that when one component (or layer) is described as being on another component (or layer), the one component may be directly on the other component, or one or more other components or layers may be between the one component and the other component. In addition, when one component is expressed as being directly on or above another component, no other component(s) are between the one component and the other component. Moreover, being on "top", "upper", "lower", "above", "bottom", "below," or "one (a first) side" or "side" of a component means a relative positional relationship.

The terms first, second, third, etc. may be used to describe various items, such as various components, regions and/or parts. However, the items are not limited by these terms.

In addition, it should be noted that, where certain embodiments are otherwise feasible, certain process sequences may be performed other than as described below. For example, two processes described in succession may be performed substantially simultaneously or in the reverse order.

The term "metal oxide semiconductor" (MOS) as used below is a general term, and "M" is not limited to only metal, and may refer to various types of conductors. Also, "S" may be a substrate or a semiconductor, and "O" is not limited to oxide, and may include various types of organic or inorganic insulating materials.

In addition, the conductivity type or dopant type of a region or component may be defined as "p-type" or "n-type" according to the main carrier characteristics, but this is only for convenience of description, and the technical spirit of the present disclosure is not limited to what is illustrated or described. For example, hereinafter, the terms "p-type" or "n-type" may be replaced with the more general terms "first conductivity type" or "second conductivity type", and here, the first conductivity type may refer to p-type, and the second conductivity type may refer to n-type.

Furthermore, it should be understood that "high concentration" and "low concentration" expressing the doping concentration of an impurity region refers to the relative doping concentration of one component to one or more other components.

It should be noted that a high voltage semiconductor device described below is applicable to both N-LDMOS and P-LDMOS devices.

Figure 2:
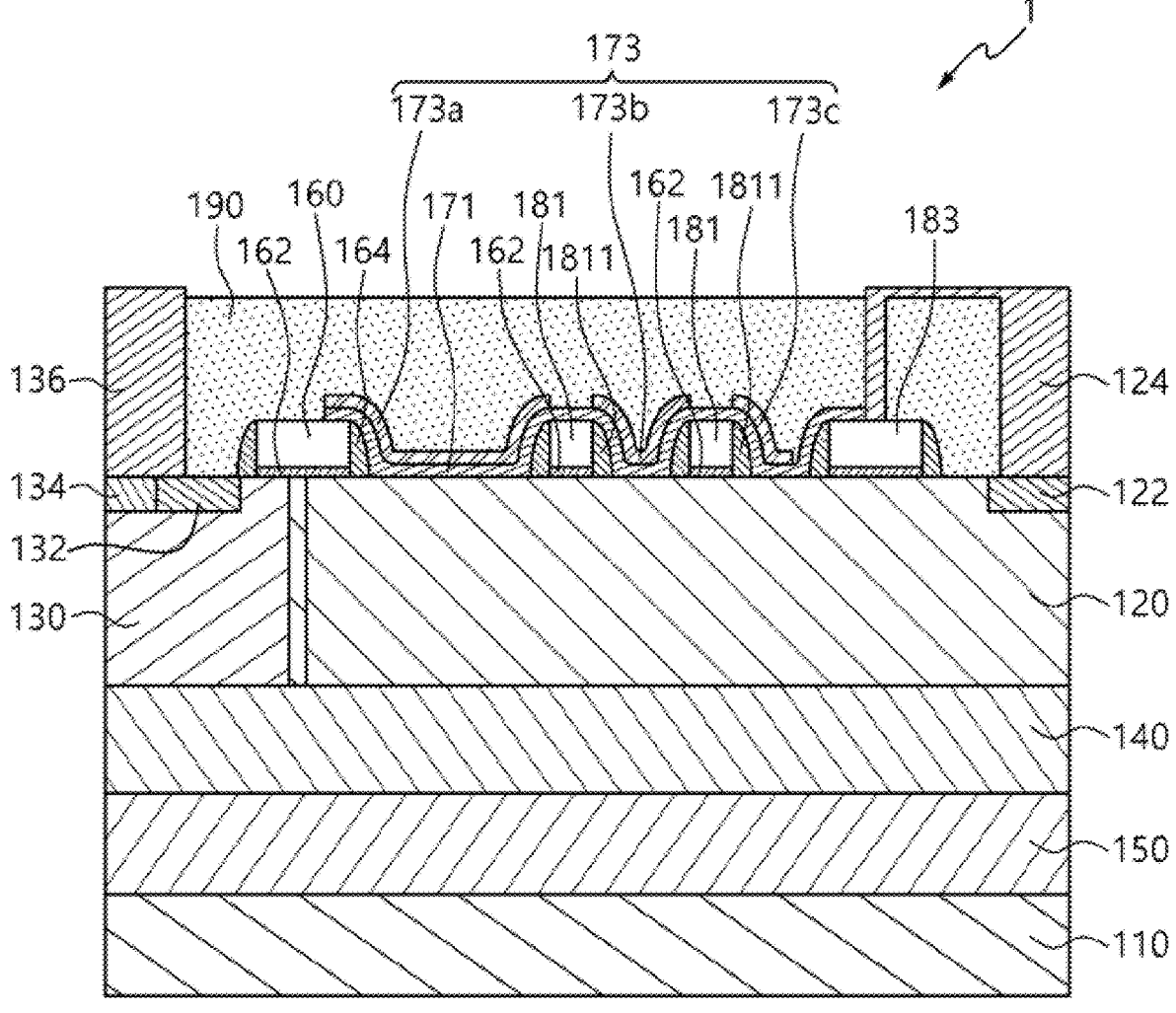
FIG. 2 is a cross-sectional view of a high voltage semiconductor device according to an embodiment of the present disclosure.
Figure 3:
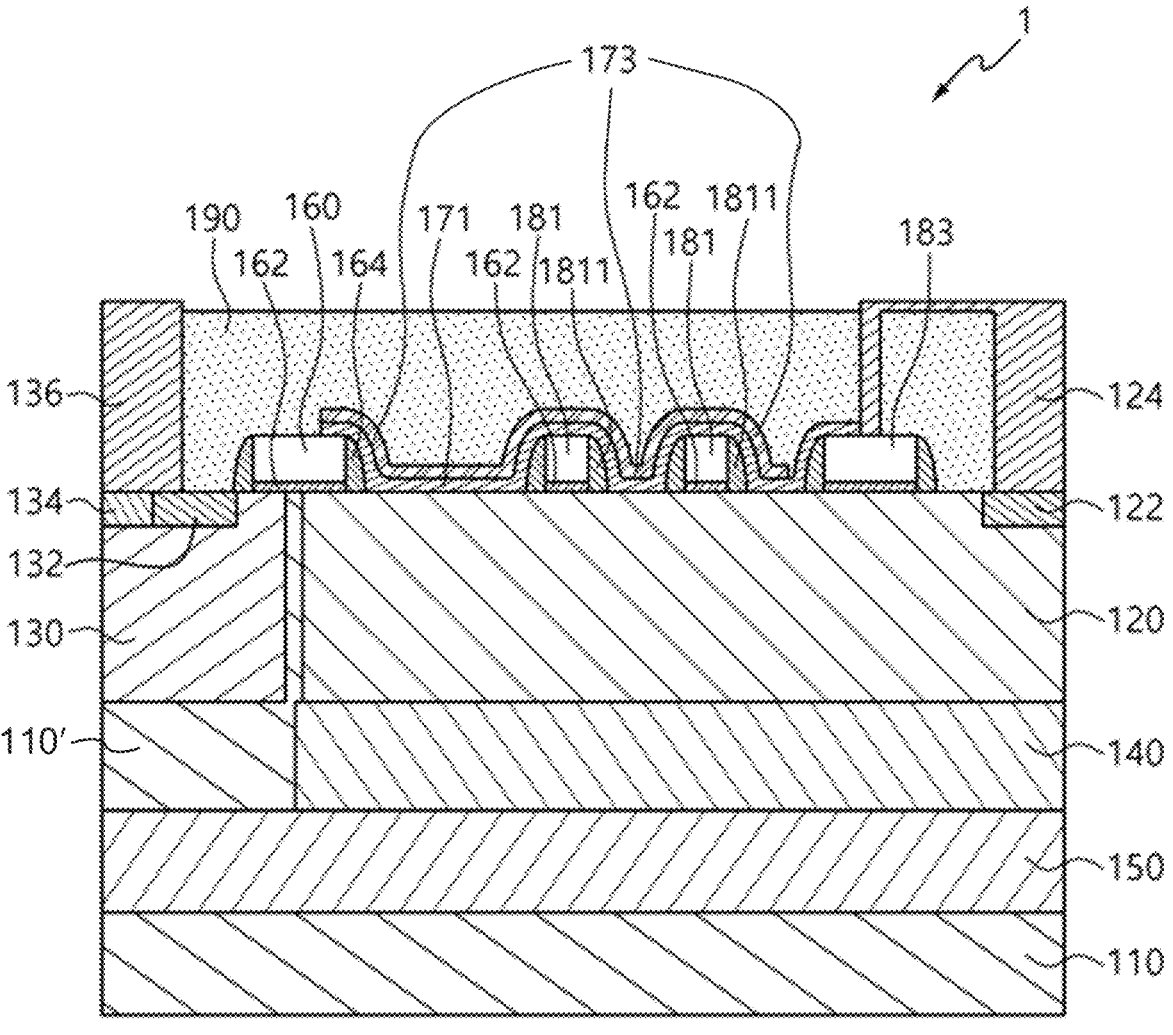
FIG. 3 is a cross-sectional view of a high voltage semiconductor device according to another embodiment of the present disclosure.

FIG. 2 is a cross-sectional view of a high voltage semiconductor device according to an embodiment of the present disclosure, and FIG. 3 is a cross-sectional view of a high voltage semiconductor device according to another embodiment of the present disclosure.

Hereinafter, a high voltage semiconductor device according to exemplary embodiments of the present disclosure will be described in detail with reference to the accompanying drawings.

Referring to FIG. 2, the present disclosure relates to a high voltage semiconductor device 1 and, more particularly, to a high voltage semiconductor device 1 that enables more effective integration through improvement of breakdown voltage (BV) characteristics during device turn-on and/or turn-off and consequent improvement of specific on-resistance (Rsp) characteristics by including a floating gate 181 and/or a connection structure 183 between a gate electrode and a drain 122.

The floating gate 181 and the connection structure 183 described above may be together in a single semiconductor device, or only one of the structures may be present, and in this regard, there is no particular limitation on the scope of the present disclosure.

The high voltage semiconductor device 1 according to embodiments of the present disclosure includes a substrate 110. A well (not shown) that may define an active region of the device 1 may be on or in the substrate 110, and the active region may be (further) defined by a device isolation layer (also not shown). The substrate 110 may be or comprise a substrate doped with a first conductivity type dopant, a P-type diffusion region in a single-crystal silicon substrate, or a single-crystal silicon substrate having a P-type epitaxial layer epitaxially grown thereon. The device isolation layer may comprise a shallow trench isolation (STI) structure, and is not particularly limited thereto.

A drift region 120 may be on or in the substrate 110. The drift region 120 comprises, for example, an impurity doped region having a second conductivity type, and may be in contact with or spaced apart from a body region 130 (to be described later) by a predetermined distance. When the doping concentration in the drift region 120 is below a first certain level, the on-resistance characteristics may deteriorate. On the contrary, when the doping concentration is above a second, higher certain level, the on-resistance characteristics improve, but the breakdown voltage characteristics deteriorate. Thus, it is desirable for the drift region 120 to have an appropriate doping concentration or level in consideration of these characteristics. On-resistance and breakdown voltage characteristics have a trade-off relationship. It is more preferable that the drift region 120 has a lower doping concentration than that of a drain 122, which will be described later.

The drain 122 may be at the surface of the substrate 110, within the drift region 120. That is, the drift region 120 may surround and/or be below the drain 122. The drain 122 may be electrically connected to a drain electrode (not shown) by a drain contact 124. In addition, the drain 122 may be electrically connected to the connection structure 183 to be described later, and, for example, may be connected to the connection structure 183 by a drain contact 124. However, it is preferable that the drain 122 is not electrically connected to the floating gate 181. The drain 122 comprises, for example, a high-concentration impurity doped region having the second conductivity type, and may have a higher concentration of impurities than the drift region 120.

The drain contact 124 is electrically connected to the drain 122, and preferably includes a conductive metal such as copper, aluminum, tungsten, or an alloy thereof, but the scope of the present disclosure is not limited by these examples. The drain contact 124 may pass through a lower insulating film 190 on the substrate 110. The lower insulating film 190 may comprise a pre-metal dielectric (PMD) layer, in that it is formed before a metal wiring layer (e.g., providing one or more signals to the source 132 and the drain 122).

The body region 130 may be on or in the substrate 110. The body region 130 comprises, for example, an impurity doped region having a first conductivity type, and may be spaced apart from the drift region 120 by a predetermined distance. A source 132 may be at the surface of the substrate 110 in the body region 130. The source 132 comprises, for example, a high-concentration impurity doped region having the second conductivity type, and may be electrically connected to a source electrode (not shown) by a source contact 136. In addition, a body contact 134 may be adjacent to or in contact with the source 132. The body contact 134 comprises, for example, a high-concentration impurity doped region having the first conductivity type, and may be at the surface of the substrate 110 in the body region 130.

The source contact 136 is electrically connected to the source 132, and preferably includes a conductive metal such as copper, aluminum, tungsten, or an alloy thereof (e.g., the same metal as the drain contact 124), but the scope of the present disclosure is not limited by the above examples. The source contact 136 may pass through the lower insulating film 190 on the substrate 110.

A deep well 140 may be below the drift region 120. The deep well 140 comprises, for example, an impurity doped region having the first conductivity type. The deep well 140 allows the semiconductor device 1 to have a higher breakdown voltage and helps to increase the concentration of the drift region 120 to a certain extent, thereby improving the current-carrying capability of the semiconductor device 1. In addition, the deep well 140 may cross under part or all of the body region 130 (see FIG. 2) or not (see FIG. 3), and the scope of the present disclosure is not limited by a specific example. The deep well 140 is not an essential component of the present disclosure.

A buried layer 150 may be below the drift region 120 and the body region 130 and, optionally, below the deep well 140. The buried layer 150 comprises, for example, an impurity doped region having the second conductivity type and is in the substrate 110. The buried layer 150 may suppress the flow of electrons generated by a voltage applied to the drain electrode into the substrate 110 (that is, it may suppress latch-up or noise in other areas of the device 1).

A gate electrode 160 is on the substrate 110, and to be specific, the gate electrode 160 may be between the drain 122 and the source 132 (e.g., over the active region). The gate electrode 160 is on or over a channel region of the device 1, and the channel region may be turned on or off by a voltage applied to the gate electrode 160. The gate electrode 160 may include conductive polysilicon, a metal, a conductive metal nitride, or a combination thereof, and may be formed by chemical vapor deposition (CVD), physical vapor deposition (PVD), atomic layer deposition (ALD), metalorganic atomic layer deposition (MOALD), or metalorganic chemical vapor deposition (MOCVD), or the like. Since a field oxide formed by local oxidation of silicon (LOCOS) is not under the gate electrode 160, it is preferable that the gate electrode 160 have a substantially constant height and a uniform thickness (e.g., along the horizontal direction as shown in FIG. 2). In addition, due to non-formation of the LOCOS field oxide, electrical current moves along a substantially straight path between the drain 122 and the source 132, and thus the on-resistance characteristics may further improve.

A gate insulating film 162 is between the gate electrode 160 and the surface of the substrate 110. The gate insulating film 162 may include a silicon dioxide film (e.g., a thermal oxide), a high dielectric constant film (e.g., hafnium dioxide, hafnium silicate, zirconium dioxide, zirconium silicate, etc.), or a combination thereof. The gate insulating film 162 may be formed by ALD, CVD, or PVD. In addition, the gate insulating film 162 may be under the floating gate 181 and/or the connection structure 183 to be described later.

Side surfaces of the gate electrode 160 and the gate insulating film 162 may be covered with a gate spacer 164, and the gate spacer 164 may comprise an oxide (e.g., silicon dioxide), a nitride (e.g., silicon nitride), or a combination thereof (e.g., silicon nitride on silicon dioxide).

In addition, an insulating pattern 171 on at least one side of the gate electrode 160 may partially overlap the upper surface of the gate electrode 160. For example, one end of the insulating pattern 171 may be on an uppermost surface of the gate electrode 160 and may extend a predetermined distance toward the drain 122 on or over the drift region 120. For example, one end of the insulating pattern 171 is on the uppermost surface of the gate electrode 160, and an opposite end is on an uppermost surface of the connection structure 183, and may be continuous, but the scope of the present disclosure is not limited thereto. Like the gate insulating film 162, the insulating pattern 171 may also include a silicon dioxide film, a high-k dielectric film, or a combination thereof, but is not particularly limited thereto.

A field plate 173 may be on the insulating pattern 171, in a shape complementary to the uppermost surface of (e.g., conformal to) the insulating pattern 171. The field plate 173 may be on or over the gate electrode 160 and the drift region 120. To be specific, the field plate 173 may be on the drift region 120 and have one end that overlaps the gate electrode 160 and an opposite end that does not overlap the drain 122. In addition, the field plate 173 may or may not be electrically connected to the gate electrode 160 by a gate contact (not shown). The field plate 173 may include, for example, impurity-doped (e.g., conductive) polysilicon or a metal such as aluminum or tungsten.

Furthermore, a plurality of field plates 173*a*-*c* may be on or over the substrate 110, spaced apart from each other. In this case, the plurality of field plates 173*a*-*c* may have a structure in which they are physically or electrically unconnected to each other. For example, the plurality of field plates may include a first plate 173*a* at least partially overlapping the gate electrode 160; and a second plate 173*b* spaced apart from the first plate 173*a* and (i) adjacent to a side of the drain 122 or (ii) on, over or adjacent to one or more floating gates 181. A third plate 173*c* spaced apart from the second plate 173*b* and closer to the drain 122 may be further included. The individual field plates 173*a*, 173*b*, and 173*c* may or may not be electrically connected to the gate electrode 160, and there is no particular limitation thereto.

Hereinafter, the structure of a conventional high voltage semiconductor device 9 and the problems resulting therefrom, and the structure of the present disclosure to solve those problems will be described in detail.

Figure 1:
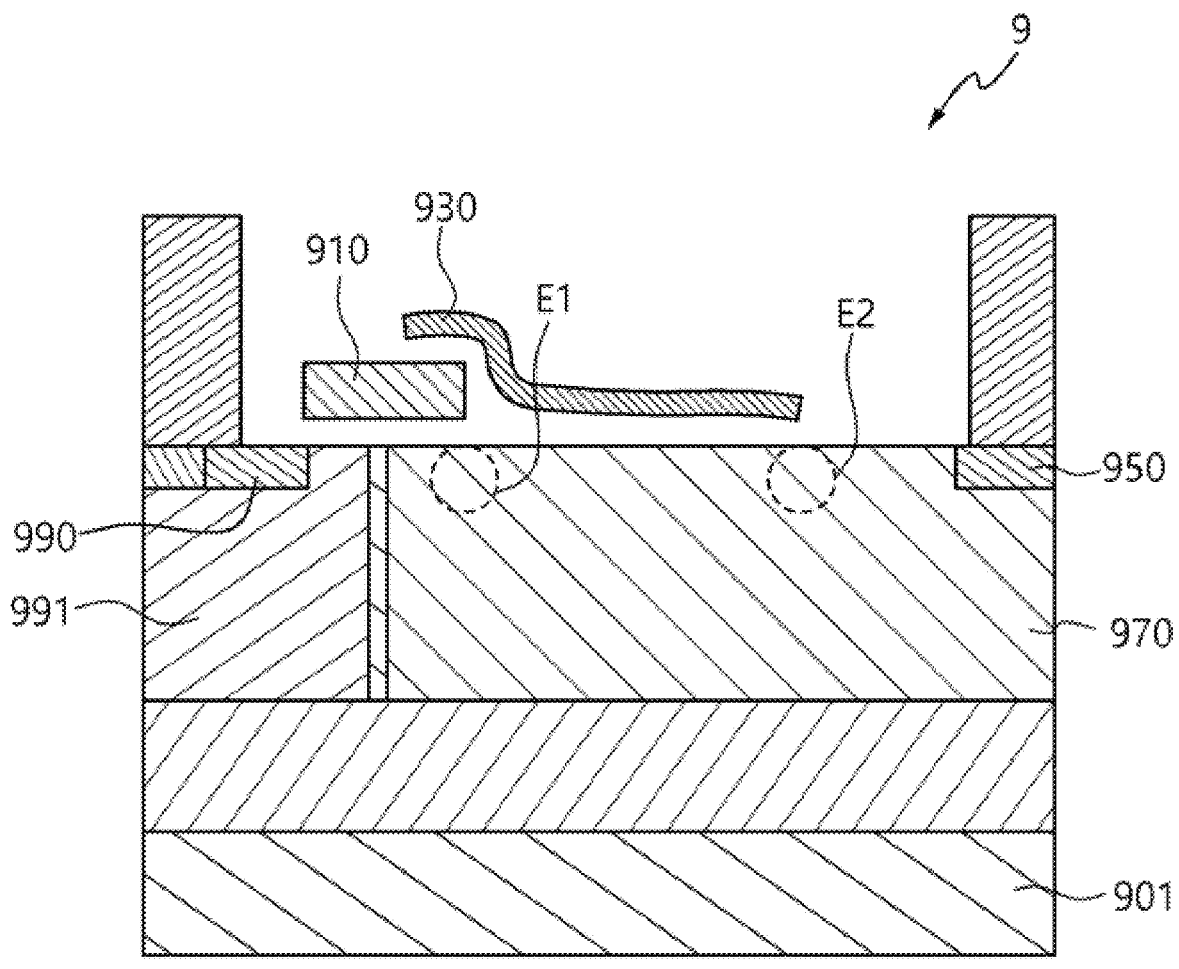
FIG. 1 is a cross-sectional view of a conventional high voltage semiconductor device.

Referring to FIG. 1, in the conventional high voltage semiconductor device 9, a reduced surface field (RESURF)

structure may include a field plate 930 and a gate electrode 910. When an electric field concentrates in an area E1 of the drift region 970 below and/or adjacent to an edge of the gate electrode 910 or in an area E2 of the drift region 970 below and/or adjacent to an edge of the field plate 930 near a drain 950, the breakdown voltage characteristics inevitably deteriorate during device turn-off. Moreover, when the device is turned on, charge carriers increase in a drift region 970 and the electric field concentrates on or near an edge or corner of the drain 950. As a result, even at a low drain voltage, impact ionization increases, and the breakdown voltage inevitably deteriorates.

In order to solve such problems, referring to FIG. 2, the high voltage semiconductor device 1 according to embodiments of the present disclosure includes the floating gate 181 and/or the connection structure 183.

The floating gate 181 has a floating configuration and is spaced apart from the gate electrode 160 on the substrate 110. Like the gate electrode 160, the floating gate 181 may include conductive polysilicon, a metal, a conductive metal nitride, or a combination thereof. It is preferable that the floating gate 181 and the gate electrode 160 are formed substantially simultaneously (e.g., in the same process[es]). The floating gate 181 may have substantially the same height as the gate electrode 160. In addition, the floating gate 181 is preferably closer to the drain 122 than the gate electrode 160, and is preferably adjacent to an end of the field plate 173 opposite to the end of the field plate 173 adjacent to or over the gate electrode 160. In addition, the floating gate 181 may be on the gate insulating layer 162, and since the floating gate 181 may be formed in the same process sequence as the gate electrode 160, a spacer 1811 having the same structure as the gate spacer 164 may be on a sidewall of the floating gate 181.

Figure 4:
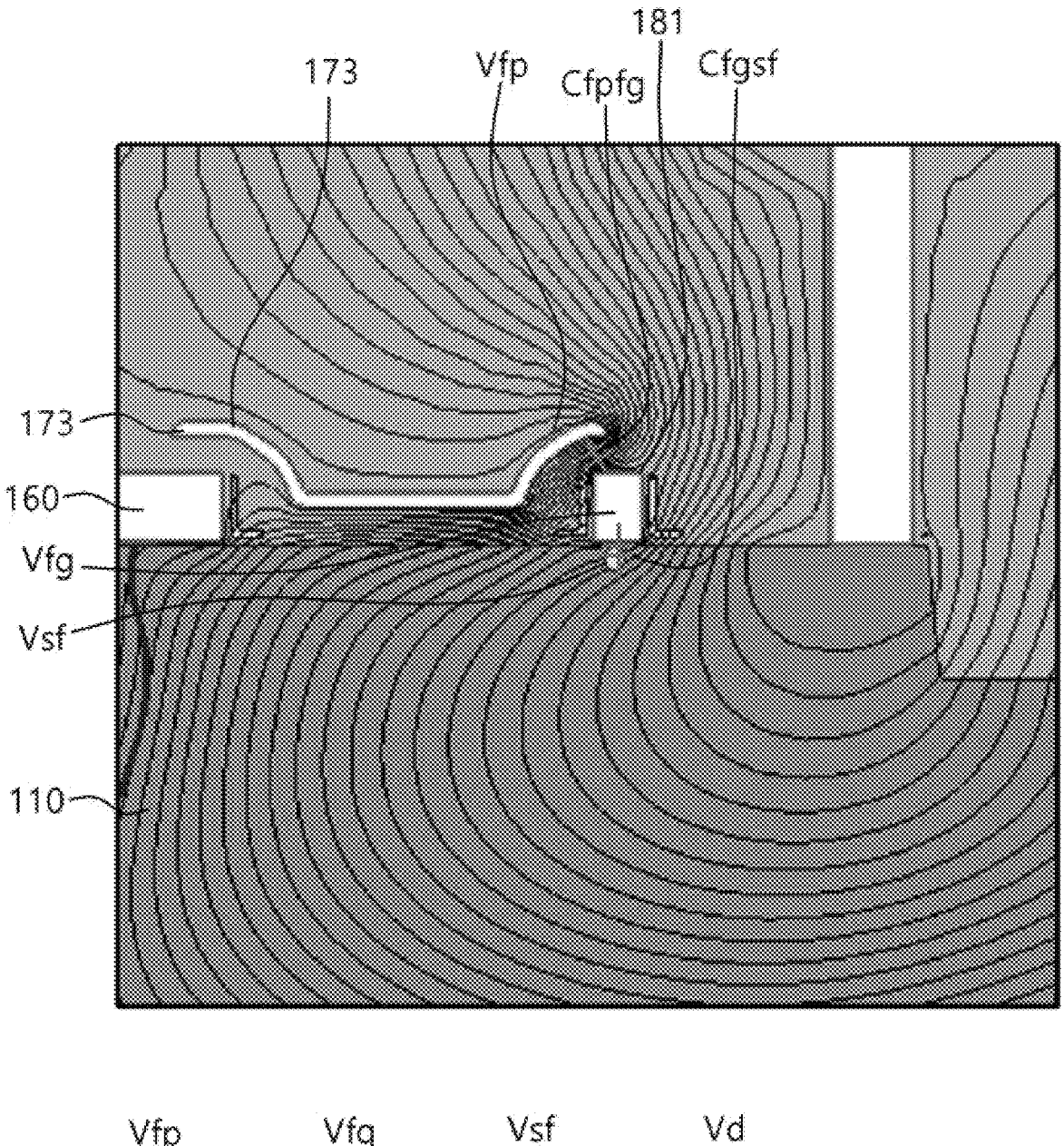
FIG. 4 is a reference view showing voltage calculations and/or electric field distribution for a high voltage semiconductor device including a floating gate.

FIG. 4 is a reference view showing voltage calculations and/or electric field distribution for a high voltage semiconductor device including a floating gate.

Referring to FIGS. 2 to 4, the voltage Vfg of the floating area 181 may be calculated by the following equation:

$$V_{fg} = (C_{fpsf} * V_{sf} + C_{fpfg} * V_{fp})/(C_{fpsf} + C_{fpfg}) \qquad (1)$$

In equation (1), Cfpsf is the capacitance between the field plate 173 and the floating gate 181, and Vsf is the voltage applied to or at the interface of the substrate 110 below the floating gate 181. In addition, Cfpfg is the parasitic capacitance between the floating gate 181 and the interface (e.g., the substrate 110). The interface voltage Vsf has a substantially proportional relationship with the drain voltage Vd. In this case, the value of Cfpfg may be determined by the distance or degree of overlap between the field plate 173 and the floating gate 181. In addition, the voltage Vfg of the floating gate 181 may affect the electric field distribution at the interface with the substrate 110. Thus, by controlling the position of the floating gate 181 and the degree of overlap with the field plate 173, the electric field distribution (e.g., in the device 1) may be appropriately controlled.

Figure 5A:
FIGS. 5A and 5B are simulation results showing electric field distributions comparing a high voltage semiconductor device including a floating gate (FIG. 5B) with an otherwise identical high voltage semiconductor device without the floating gate (FIG. 5A)
Figure 5A:
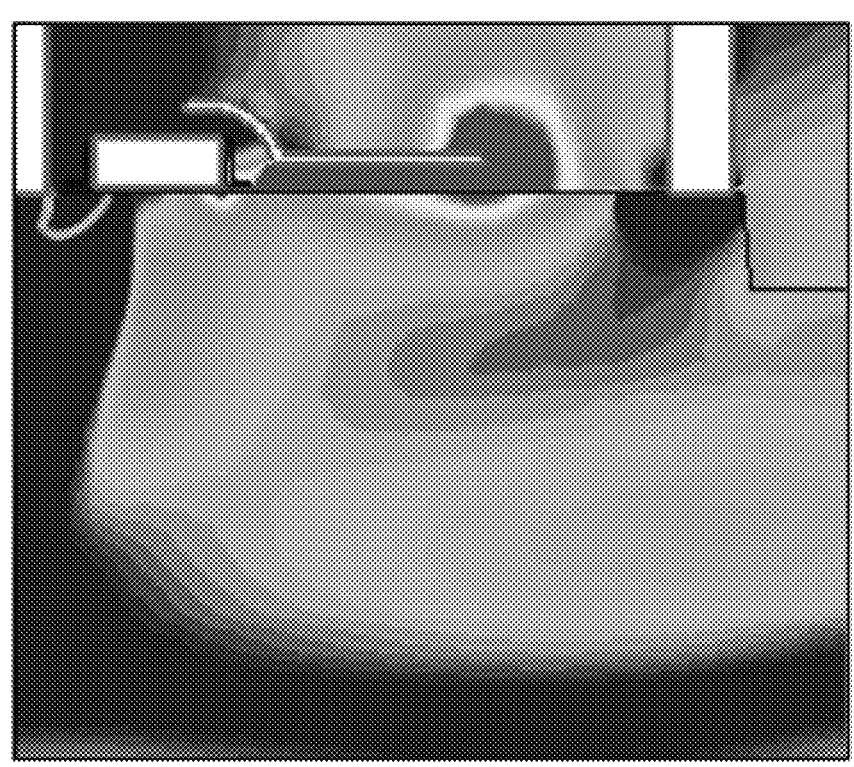
Figure 5B:
Figure 5B:
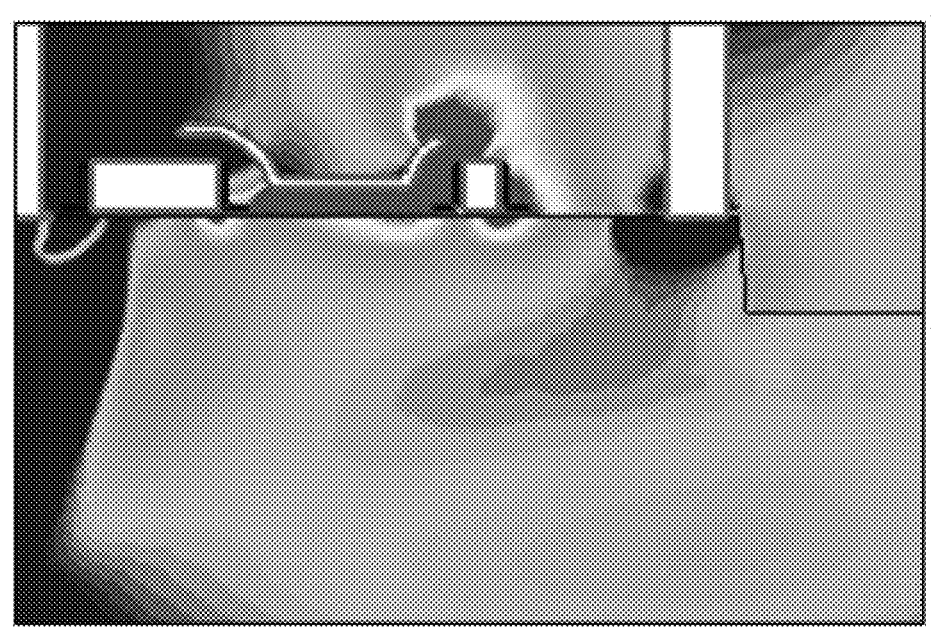
Figure 6:
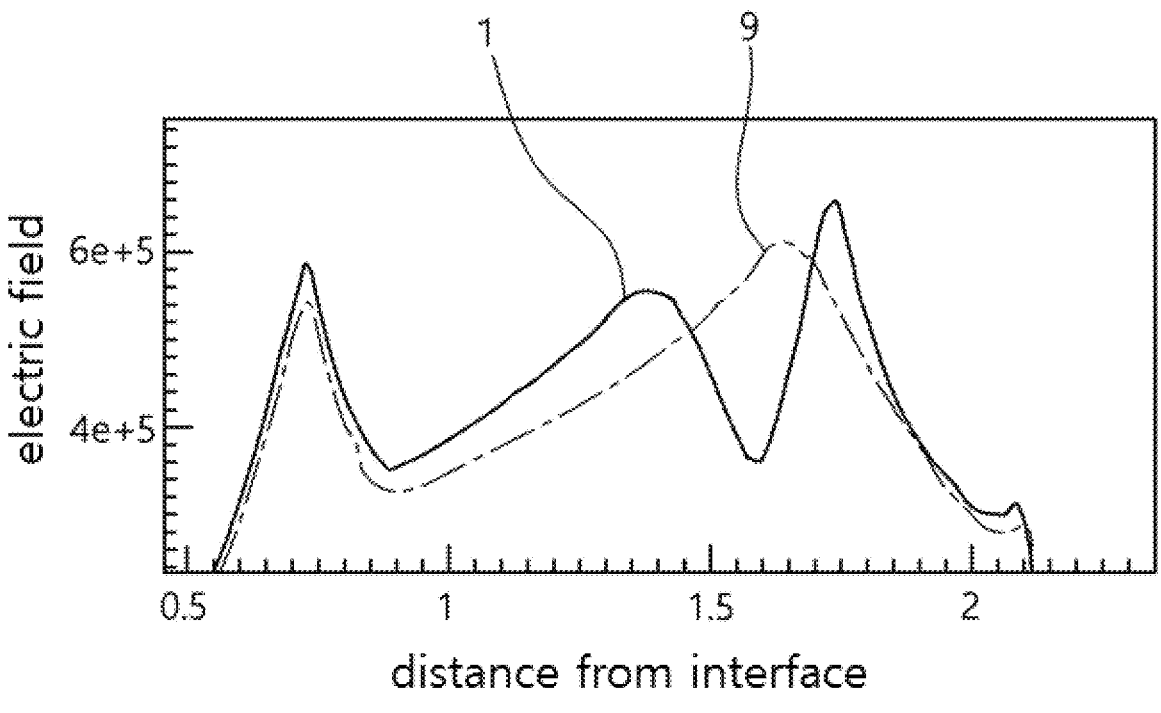
FIG. 6 is a graph showing electric field distributions for the high voltage semiconductor devices including the floating gate (the device of FIG. 5B) and without the floating gate (the device of FIG. 5A)

FIGS. 5A and 5B are simulation results showing electric field distributions comparing a high voltage semiconductor device including a floating gate (FIG. 5B) with an otherwise identical high voltage semiconductor device without the floating gate (FIG. 5A), and FIG. 6 is a graph showing electric field distributions for the high voltage semiconductor devices including the floating gate (the device of FIG. 5B) and without the floating gate (the device of FIG. 5A).

Referring to FIGS. 5A to 6, by including the floating gate 181 as described above, the electric field peak is moved toward the drain 122 (FIG. 5B), as compared to the conventional high voltage semiconductor device 9 (FIG. 5A; also compare the lines 1 and 9 in FIG. 6 corresponding to the devices 1 and 9 in FIGS. 2 and 1, respectively). In the illustrated graph, since the area of the electric field corresponds to the breakdown voltage value when turned off, it can be seen that the breakdown voltage characteristics of the high voltage semiconductor device 1 are improved. The floating gate 181 preferably does not contact the field plate 173.

Referring to FIG. 2, a plurality of floating gates 181 may be on the substrate 110 and spaced apart from each other to further improve the breakdown voltage of the semiconductor device 1. The plurality of floating gates 181 are all on a corresponding gate insulating film 162, and each of the floating gates 181 may include the spacer 1811. The floating gates 181 improve the breakdown voltage when the semiconductor device 1 is turned off.

The connection structure 183 is connected to the drain contact 124 and electrically connected to the drain 122. Like the gate electrode 160, the connection structure 183 may include conductive polysilicon, a metal, a conductive metal nitride, of a combination thereof. That is, the connection structure 183 and the gate electrode 160 may have a substantially identical composition and a substantially identical height.

Alternatively, like the field plate 173, the connection structure 183 may include conductive polysilicon, a metal, or a combination thereof, and may have a substantially identical composition and a substantially identical height as the field plate 173. the connection structure 183 may be substantially flat and have an even thickness, and may have a height or distance from the substrate 110 that overlaps that of the field plate 173, but the scope of the present disclosure is not limited thereto. Alternatively, as previously described, the connection structure 183 may be formed together with the floating area 181 and/or the gate electrode 160. It is preferable that the connection structure 183 is not physically connected to the floating gate 181.

Figure 7A:
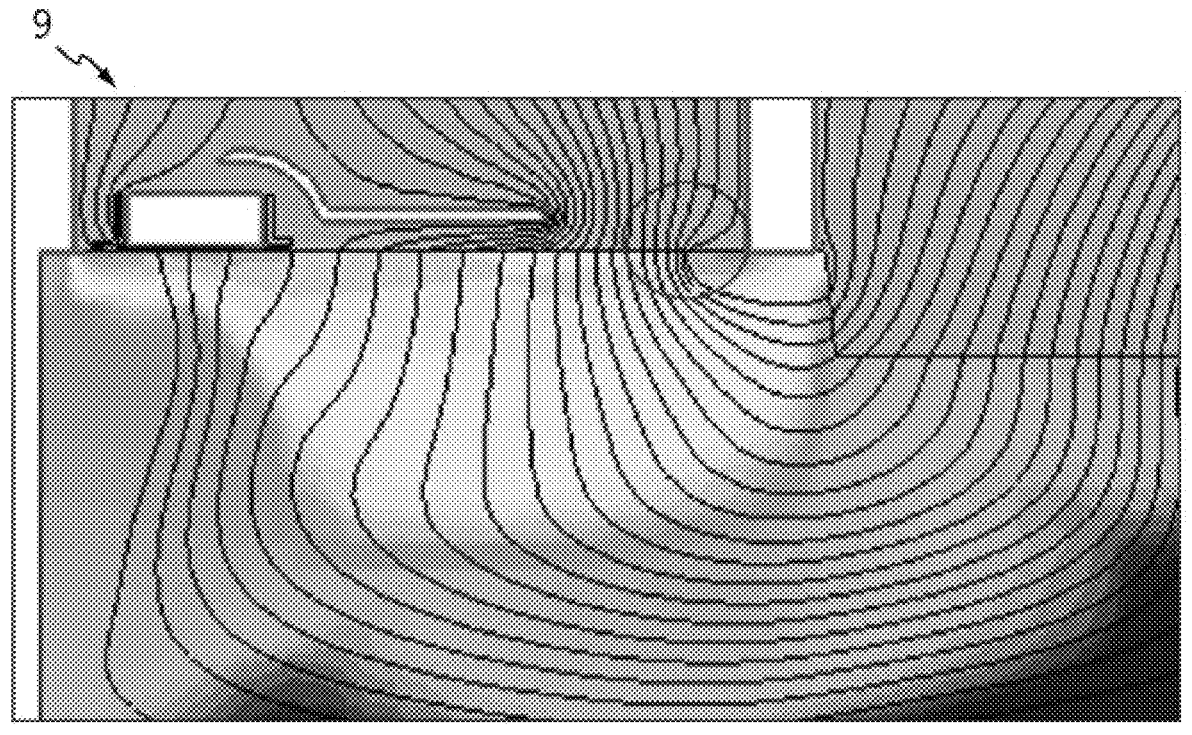
FIGS. 7A and 7B are simulation results showing electric field distributions comparing a high voltage semiconductor device including a connection structure with an otherwise identical high voltage semiconductor device without the connection structure.
Figure 7B:
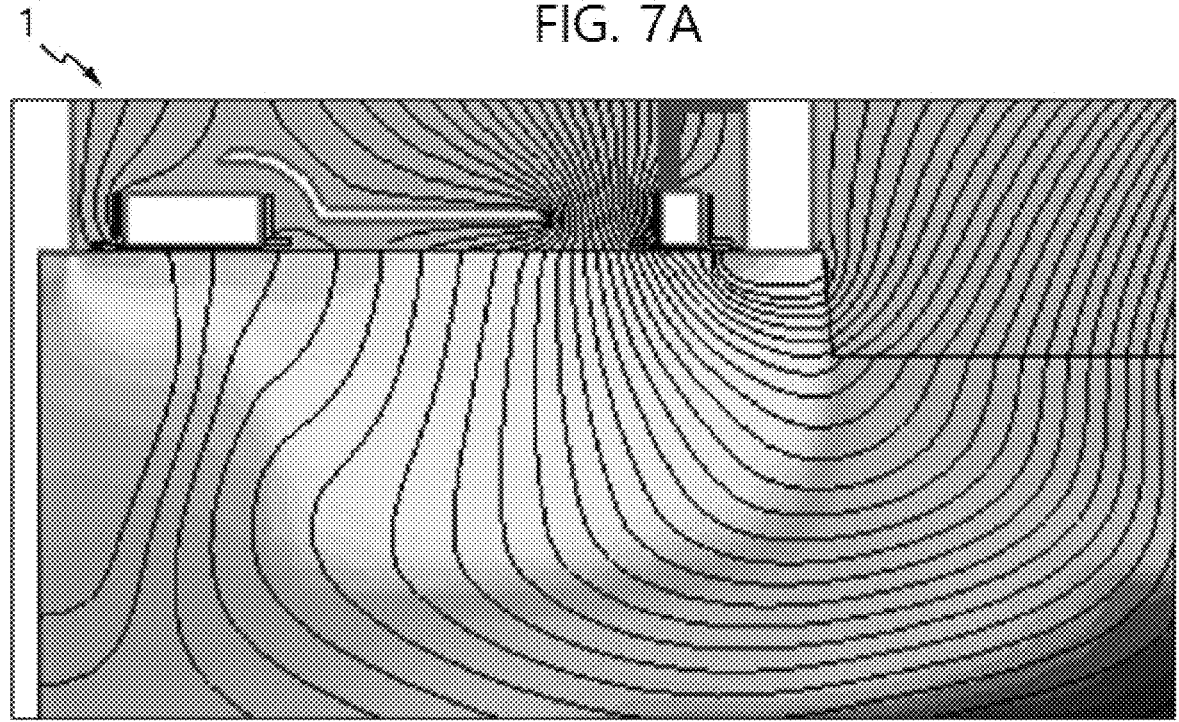
Figure 8:
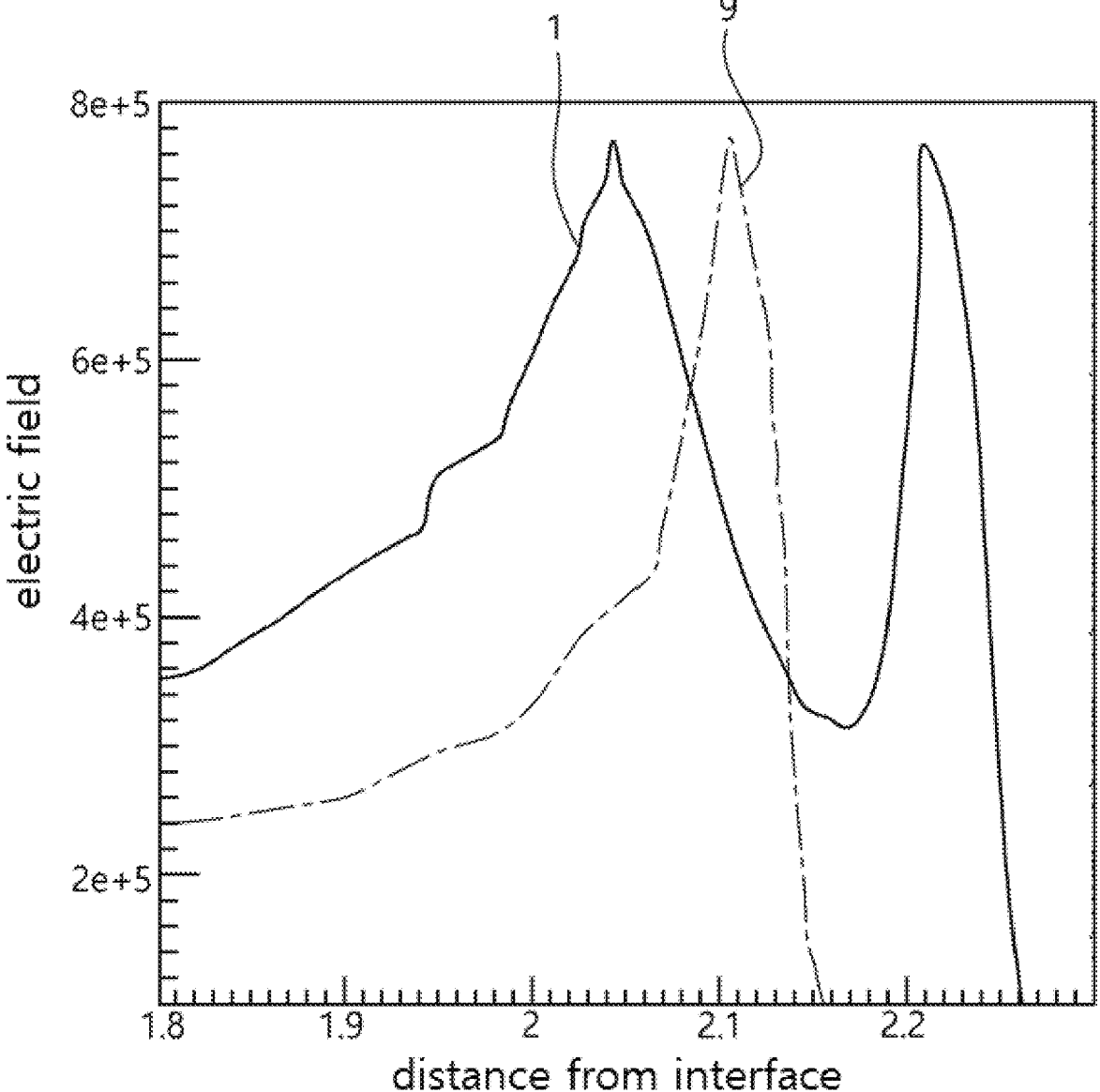
FIG. 8 is a graph showing electric field distributions for the high voltage semiconductor devices including the connection structure (the device of FIG. 7B) and without the connection structure (the device of FIG. 7A)

FIGS. 7A and 7B are simulation results showing electric field distributions comparing a high voltage semiconductor device including a connection structure with an otherwise identical high voltage semiconductor device without the connection structure, and FIG. 8 is a graph showing electric field distributions for the high voltage semiconductor devices including the connection structure (the device of FIG. 7B) and without the connection structure (the device of FIG. 7A).

Referring to FIGS. 7A to 8, the connection structure 183 as described above moves the electric field peak toward the drain 122, as compared to the conventional high voltage semiconductor device 9. In the illustrated graph, since the area of the electric field corresponds to the breakdown voltage value when turned on, the breakdown voltage characteristics of the semiconductor device 1 are improved.

A metal silicide film (not shown) may be on the drain 122, the source 134, the gate electrode 160 and the body contact 136, but a description thereof will be omitted.

FIGS. 9 to 18 are cross-sectional views showing structures formed in an exemplary method of manufacturing the high voltage semiconductor device according to embodiments of the present disclosure.

Hereinafter, a method of manufacturing a high voltage semiconductor device according to embodiments of the present disclosure will be described in detail with reference to the accompanying drawings. It should be noted that the formation of each component may be different in time from that described, or different components may be formed substantially simultaneously. In addition, the method of manufacturing each component to be described below is only exemplary and the scope of the present disclosure is not limited thereto.

Figure 9:
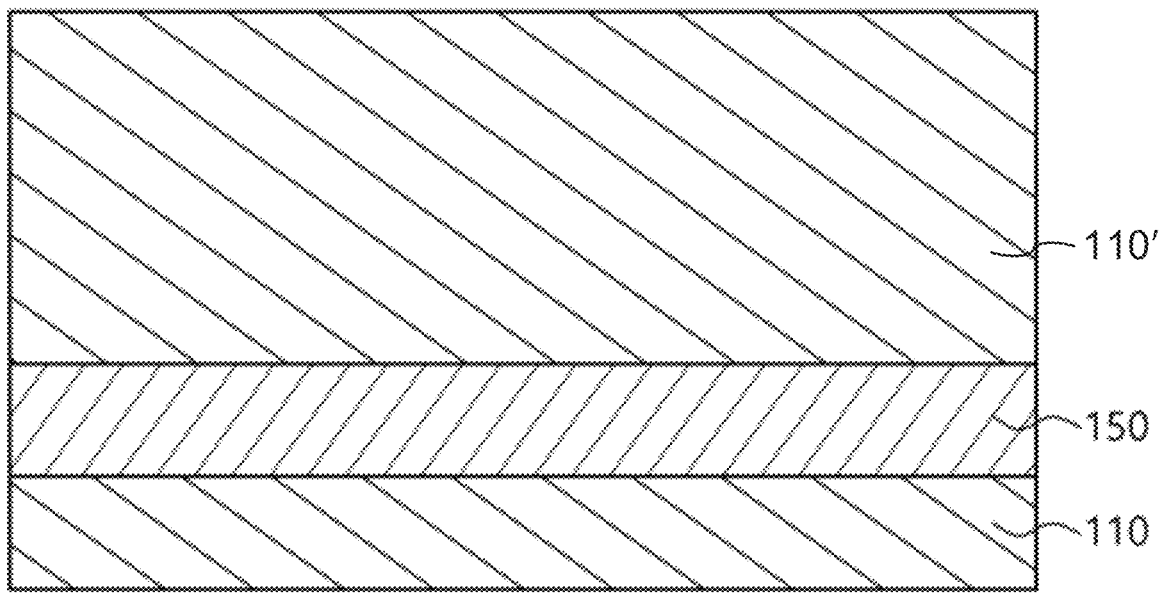
FIGS. 9 to 18 are cross-sectional views showing structures formed in an exemplary method of manufacturing the high voltage semiconductor device according to embodiments of the present disclosure.

First, referring to FIG. 9, a buried layer 150 may be formed by growing epitaxial layer having the first conductivity type on the substrate 110. Hereinafter, the substrate 110 may include all epitaxial layers thereon. The buried layer 150 may comprise, for example, a silicon layer having an identical or substantially identical crystal lattice as the substrate 110, and may further include an impurity having the second conductivity type. As shown in FIG. 9, additional epitaxial silicon 110' having substantially the same crystal lattice as the buried layer 150 and the same chemical composition as the substrate 110 may be grown on the buried layer 150 by epitaxy. The additional epitaxial silicon 110' may be considered to be part of the substrate.

Figure 10:
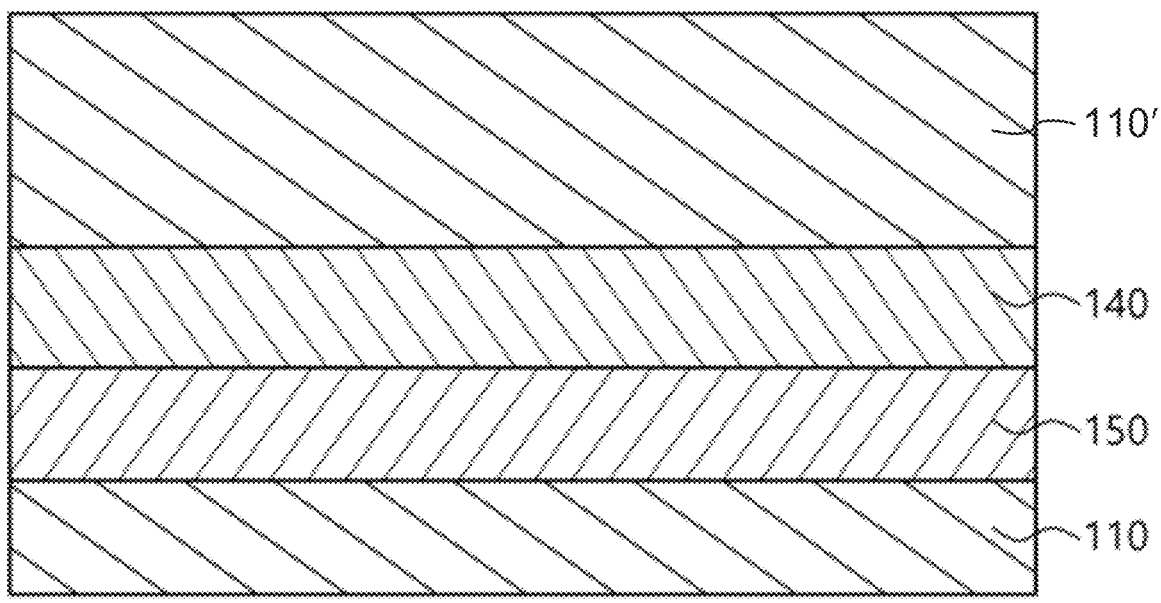

Then, referring to FIG. 10, a deep well 140 may be formed in the additional epitaxial silicon 110', on, adjacent to or overlapping with the buried layer 150. The deep well 140 comprises, for example, an impurity doped region having the first conductivity type, and may be formed by ion implantation. As previously described, the deep well 140 may cross under a body region 130 and/or under a drift region 120 (to be described later), or substantially only under the drift region 120, and there is no particular limitation thereto. When the deep well 140 is only under the drift region 120, there is an advantage in that the same mask pattern (not shown) used to form the drift region 120 may also be used to form the deep well 140.

Figure 11:
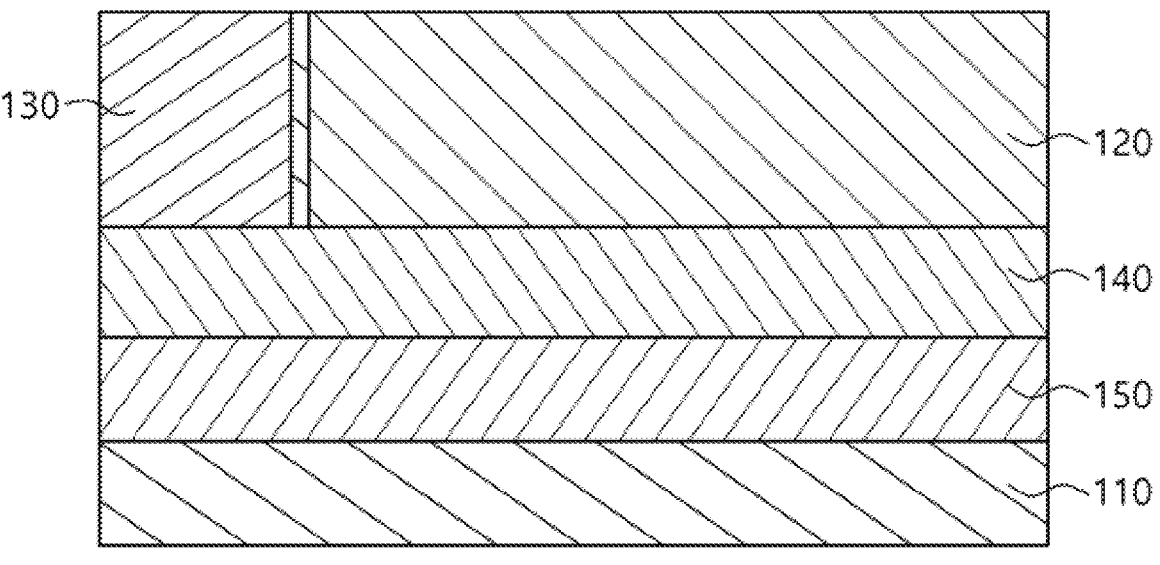

Thereafter, referring to FIG. 11, the drift region 120 and the body region 130 may be formed in the substrate 110'. For example, the drift region 120 may comprise an impurity doped region having the second conductivity type, and the body region 130 may comprise an impurity doped region having the first conductivity type. The drift region 130 and the body region 130 may be formed by ion implantation using different corresponding mask patterns (not shown).

Figure 12:
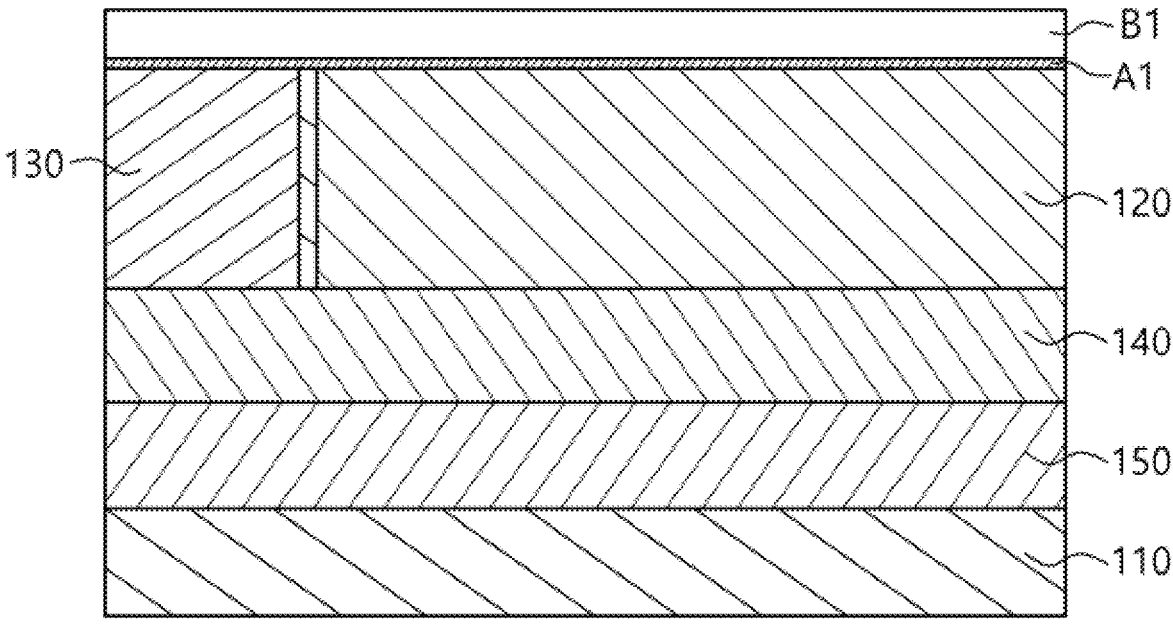

Then, a gate insulating film 162, a gate electrode 160 and one or more floating gates 181 may be formed on the surface of the substrate 110, which will be explained in detail. Referring to FIG. 12, a first insulating film A1 is deposited or grown on the substrate 110, and then a first conductive film B1 is deposited on the first insulating film A1. The first insulating film A1 may be deposited by CVD, ALD, or PVD, and may be grown by thermal oxidation (e.g., wet or dry) of silicon. The first insulating film A1 may include, for example, a silicon dioxide film, a high dielectric constant film, or a combination thereof. The first conductive film B1 may include conductive polysilicon, a metal, a conductive metal nitride, or a combination thereof.

Figure 13:
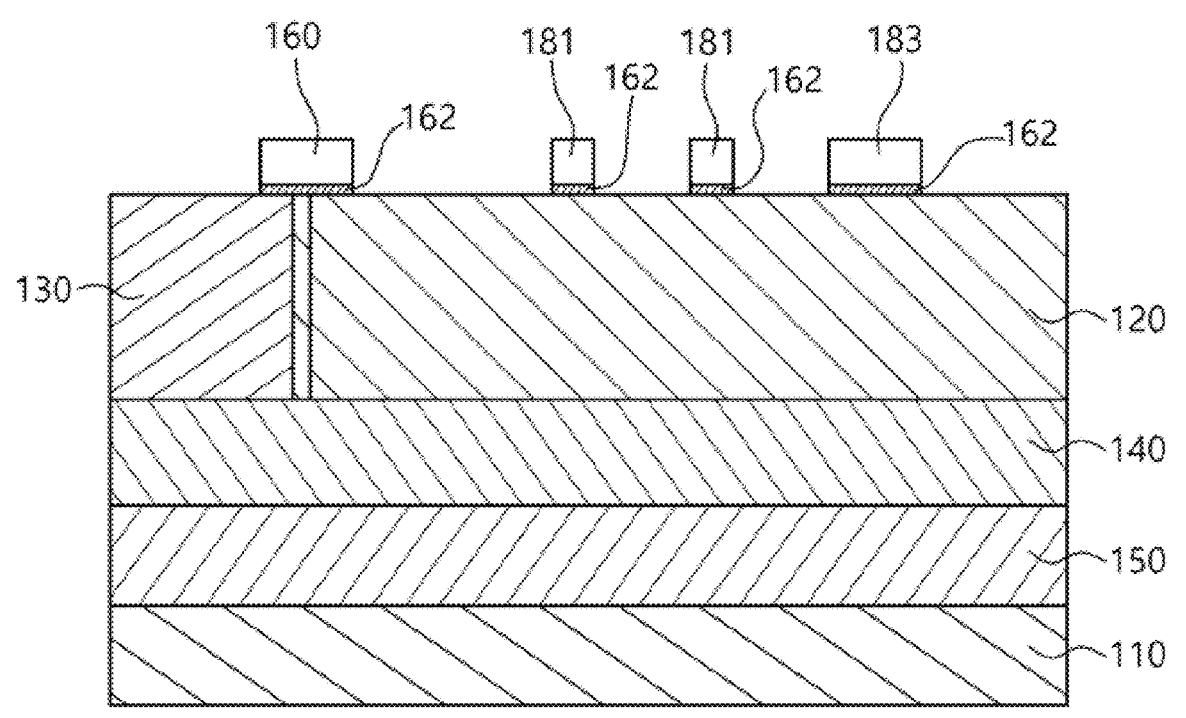

Thereafter, referring to FIG. 13, after forming a mask pattern (not shown) on the first conductive film B1, the first conductive film B1 and the insulating film A1 are sequentially etched. Accordingly, the gate insulating layer 162, the gate electrode 160, and the floating gate(s) 181 and/or a connection structure 183 may be formed. As previously mentioned, a plurality of floating gates 181 may be formed on the substrate 110, spaced apart from each other, or only one floating gate 181 may be present, and there is no particular limitation thereto.

Figure 14:
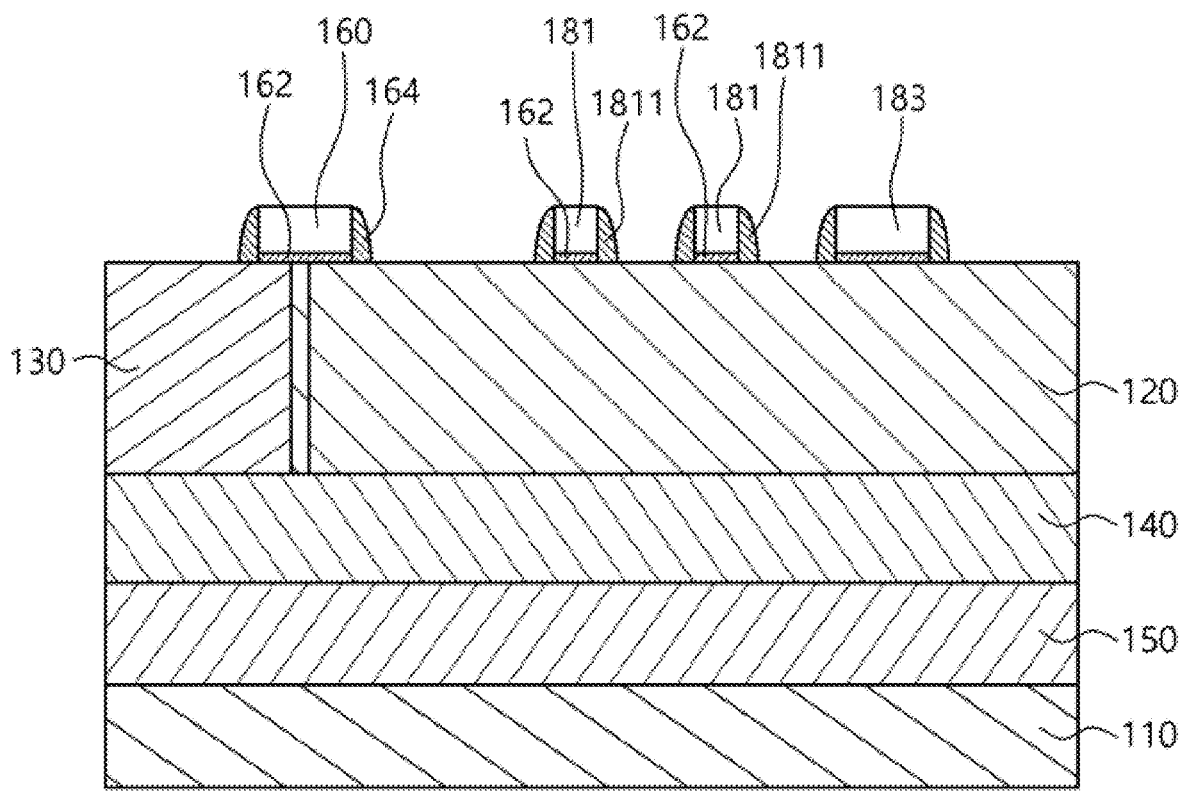

Thereafter, referring to FIG. 14, a second insulating film (not shown) may be deposited on the substrate 110, the gate electrode 160, the floating gate(s) 181 and (if present) the connection structure 183, then patterned and etched to form a gate spacer 164 on sidewalls of the gate electrode 160 and a spacer 1811 on sidewalls of each floating gate 181 and (if present) the connection structure 183. The spacers 164 and 1811 may include an oxide (e.g., silicon dioxide), a nitride (e.g., silicon nitride), or a combination thereof.

Figure 18:
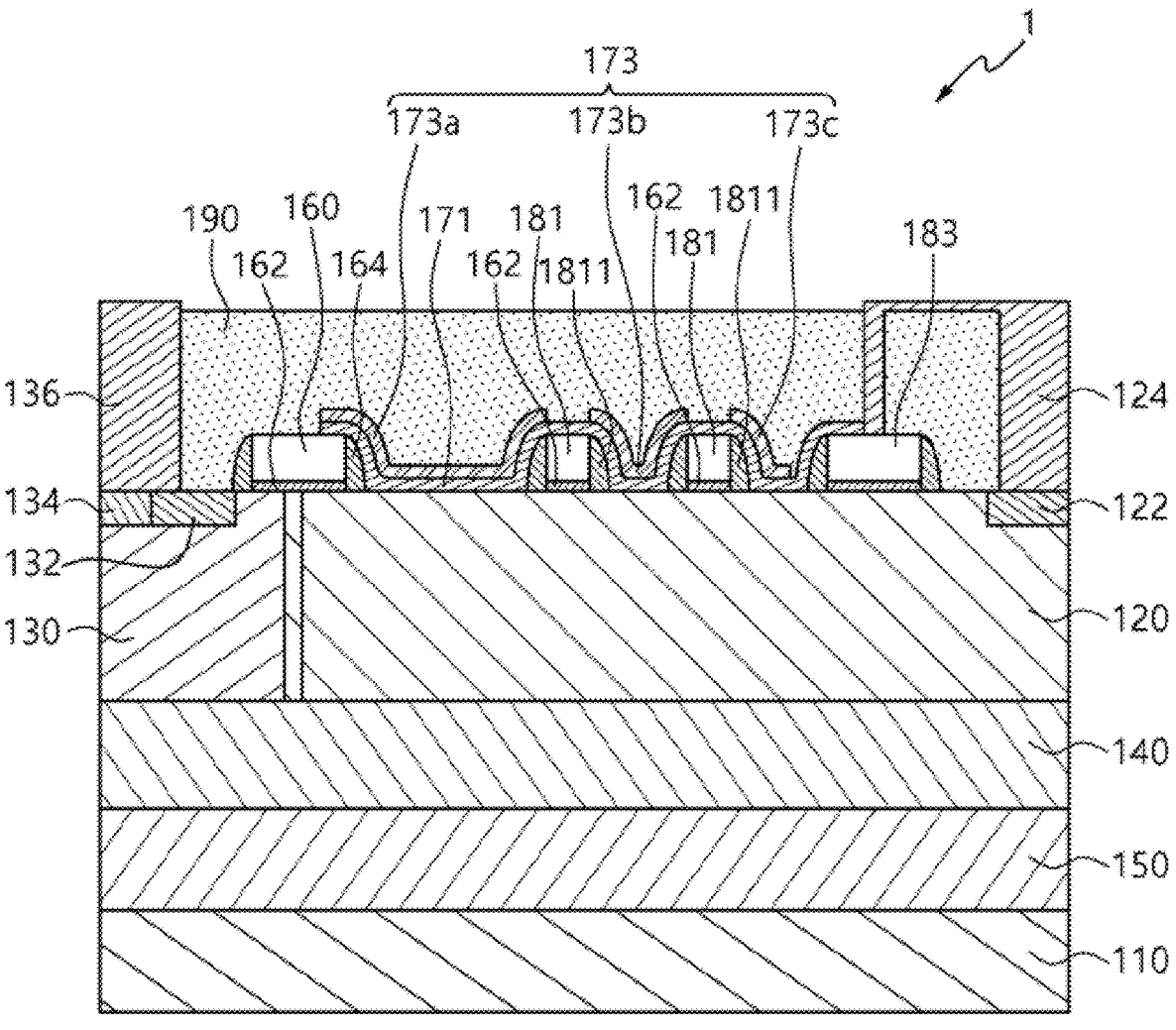

A drain 124, a source 132, and a body contact 136 may be formed in subsequent processing. For example, the drain 124 and the source 132 may comprise a high-concentration impurity doped region having the second conductivity type and, optionally, an identical or substantially identical composition and depth, and the body contact 136 may comprise a high-concentration impurity doped region having the first conductivity type. Each configuration may be formed by ion implantation through a corresponding mask pattern (not shown). A detailed description thereof will be omitted, and formation positions of the drain 124, the source 132, and the body contact 136 are as shown in FIG. 18. The drain 124 and the source 132 may be formed simultaneously (i.e., in the same processing sequence).

Figure 15:
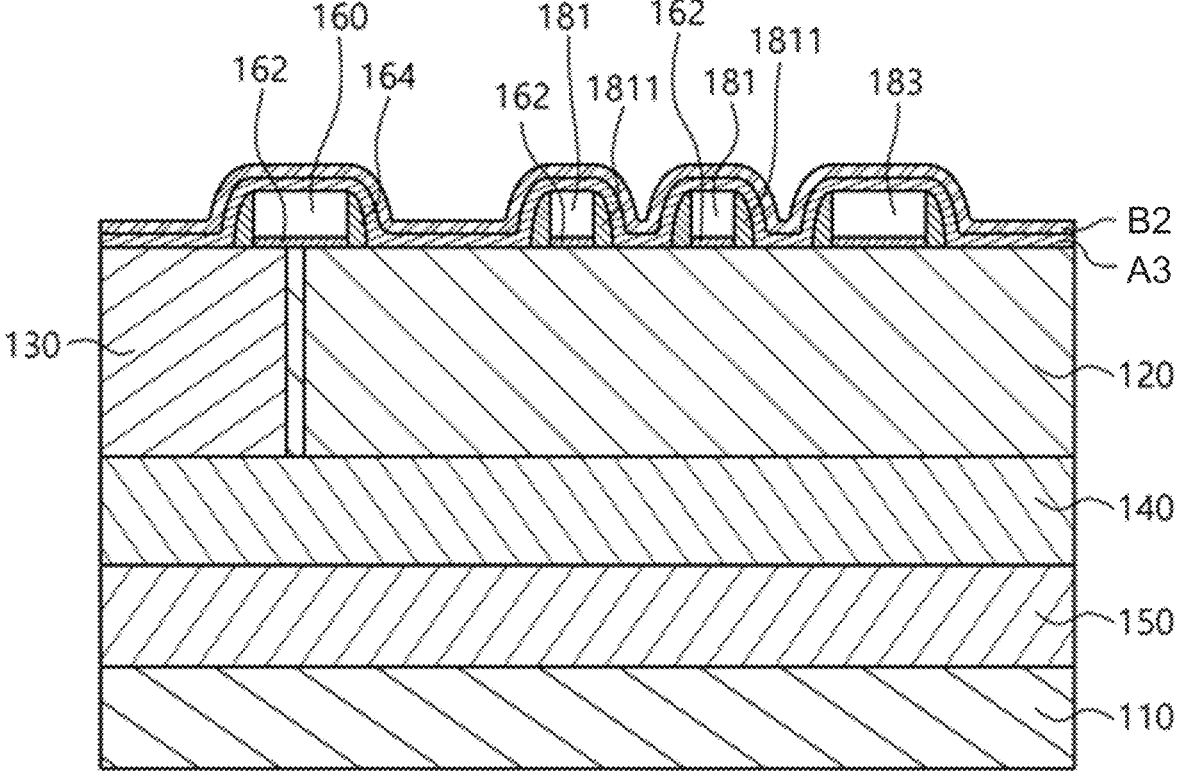

Thereafter, referring to FIG. 15, a third insulating film A3 is deposited on the substrate 110 (e.g., by CVD, ALD, PVD, etc.) to cover the gate electrode 160, the floating gate 181, and if present, the connection structure 183. Thereafter, a second conductive film B2 is deposited on the third insulating film A3. The third insulating film A3 may include a silicon dioxide film, a high dielectric constant film, or a combination thereof, and the second conductive film B2 may include impurity-doped (e.g., conductive) polysilicon or a metal such as aluminum or tungsten, but are not limited thereto.

Figure 16:
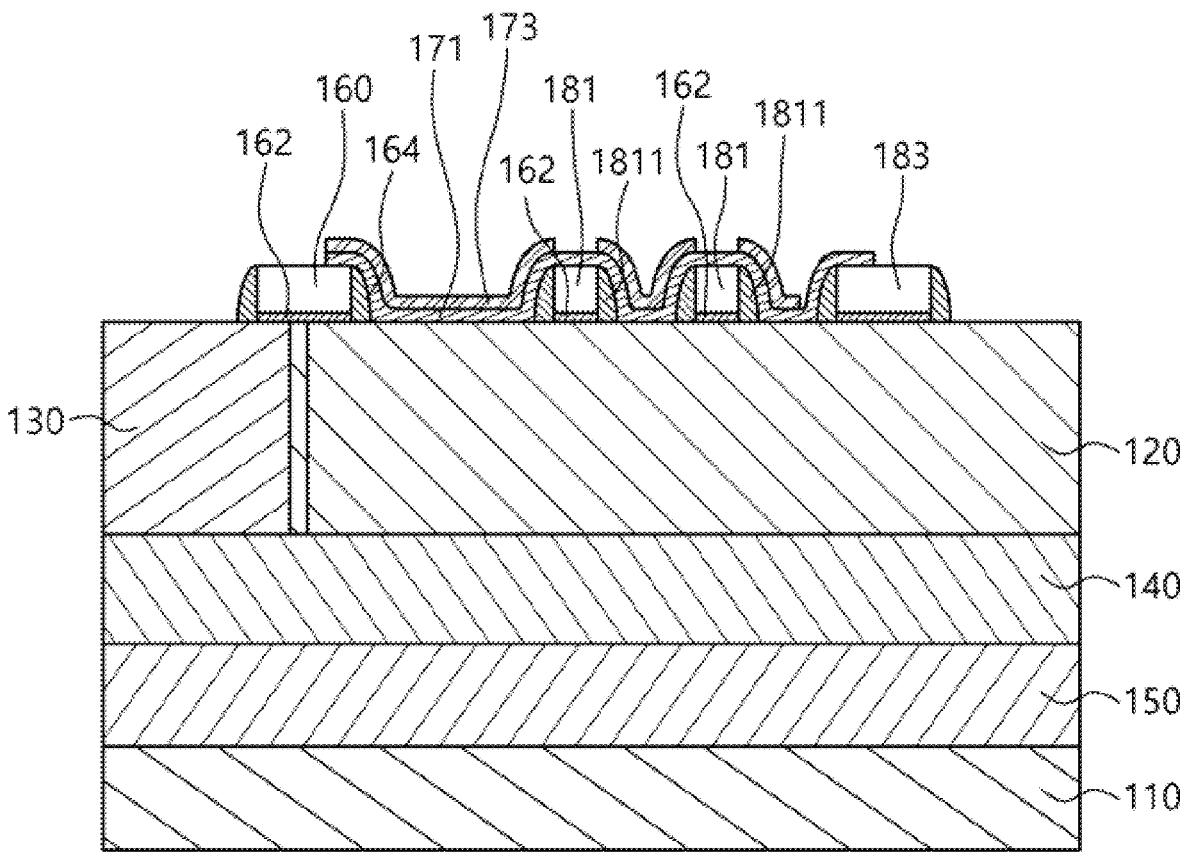

Thereafter, referring to FIG. 16, a field plate 173 and an insulating pattern 171 may be formed by photolithographically patterning a first photoresist (not shown) and etching the second conductive film B2 using the patterned first photoresist as a mask, then photolithographically patterning a second photoresist (not shown) and etching the third insulating film A3 using the patterned second photoresist as a mask. In some cases, the connection structure 183 may be formed at the same time as the field plate 173.

Figure 17:
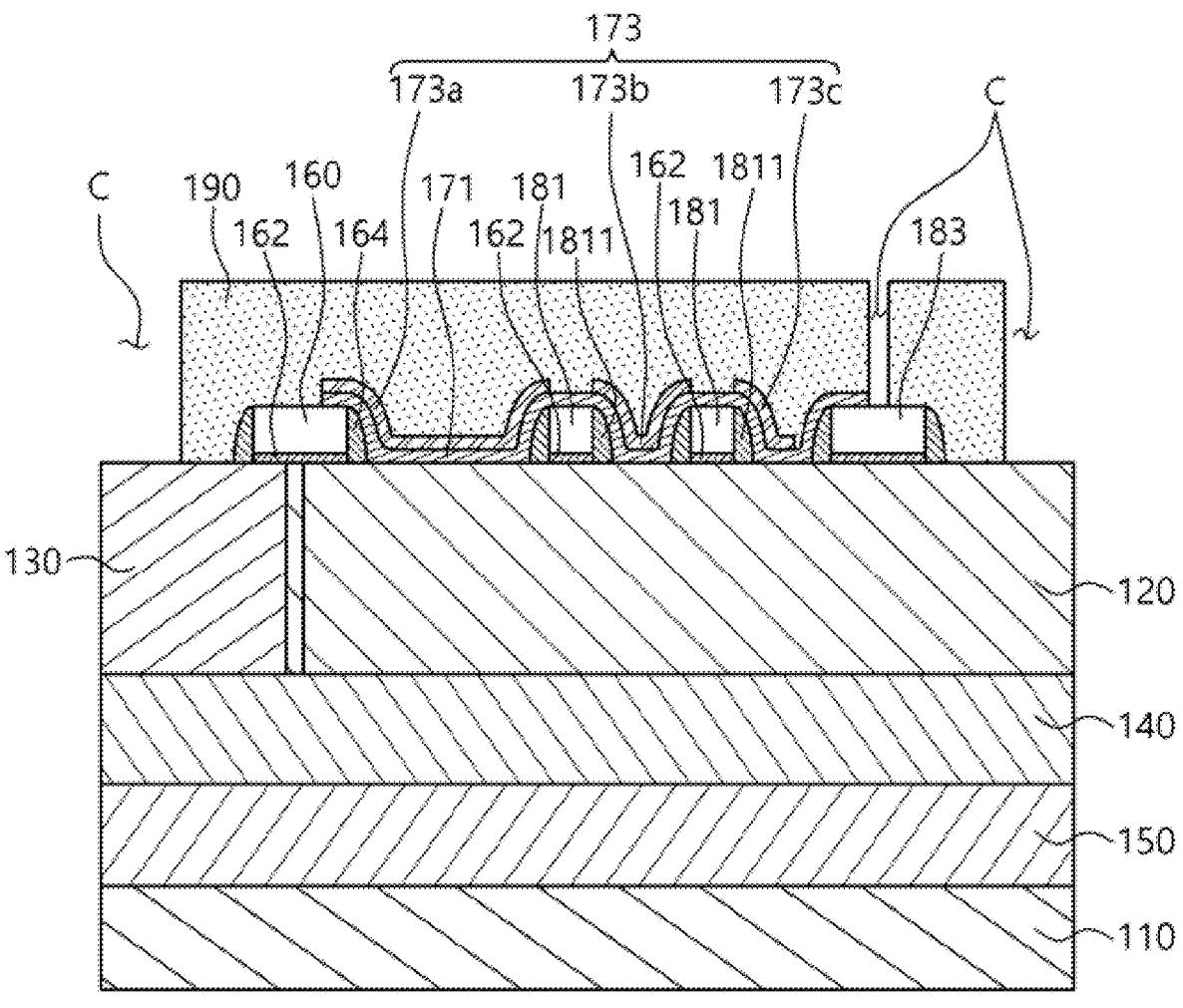

Thereafter, referring to FIG. 17, after depositing an insulating film 190 on the substrate 110, the field plate 173, the insulating pattern 171, the gate electrode 160, the floating gate 181, and if present, the connection structure 183, the insulating film 190 is etched using a third patterned photoresist (not shown) as a mask to form contact holes C, including one exposing an uppermost surface of the connection structure 183.

Thereafter, referring to FIG. 18, after depositing a first metal film to fill the contact holes C, the excess first metal film on an uppermost surface of the insulating film 190 may be removed (e.g., by chemical mechanical polishing [CMP]) to form the drain contact 124 and the source contact 136. Optionally, a metal wiring layer in contact with the drain contact 124 and the source contact 136 may be formed by depositing a second metal film on the insulating film 190, the drain contact 124, and the source contact 136, photolithographically patterning a photoresist on the second metal film, then etching the second metal film using the patterned photoresist as a mask (not shown).

The above detailed description is illustrative of the present disclosure. In addition, the above description shows and describes various embodiments of the present disclosure, and the present disclosure can be used in various other combinations, modifications, and environments. In other words, changes or modifications are possible within the scope of the concept of the disclosure herein, the scope equivalent to the written disclosure, and/or within the scope of skill or knowledge in the art. The above-described embodiments describe various states for implementing the technical idea(s) of the present disclosure, and various changes for specific applications and/or fields of use of the present disclosure are possible. Accordingly, the above detailed description is not intended to limit the present disclosure to the disclosed embodiments.

What is claimed is:

1. A high voltage semiconductor device comprising:
   a substrate;
   a drift region on the substrate;
   a body region on the substrate;
   a drain in the drift region;
   a source in the body region;
   a gate insulating film on the substrate, and a gate electrode on the gate insulating film;
   an insulating pattern on the gate electrode and the substrate;
   a conductive field plate on the insulating pattern; and
   a first floating gate between the gate electrode and the drain, wherein:
      the insulating pattern extends continuously from an uppermost surface of the gate electrode to an uppermost surface of the floating gate, and
      the conductive field plate comprises a first plate having one end on the gate electrode and an opposite end on the first floating gate, and a second plate spaced apart from the first plate and having one end on the first floating gate.

2. The high voltage semiconductor device of claim 1, further comprising:
   a body contact, adjacent to or in contact with the source.

3. The high voltage semiconductor device of claim 1, further comprising:
   a deep well in the substrate, under the drift region; and
   a buried layer in the substrate, under the deep well.

4. The high voltage semiconductor device of claim 1, further comprising a second floating gate, physically spaced apart from the first floating gate, wherein the first and second floating gates are on the substrate.

5. The high voltage semiconductor device of claim 1, wherein the floating gate is substantially coplanar with the gate electrode.

6. The high voltage semiconductor device of claim 1, wherein the floating gate has a substantially identical composition and a substantially identical height as the gate electrode.

7. The high voltage semiconductor device of claim 6, comprising a plurality of the floating gates, physically spaced apart from each other on the substrate, and between the gate electrode and the drain.

8. The high voltage semiconductor device of claim 1, further comprising:
   an insulating spacer on a sidewall of the floating gate.

9. The high voltage semiconductor device of claim 1, further comprising:
   a drain contact connecting the drain and a drain electrode;
   a connection structure connected to the drain contact.

10. The high voltage semiconductor device of claim 9, wherein the connection structure has a substantially identical composition and a substantially identical height as the gate electrode.

11. The high voltage semiconductor device of claim 10, wherein the connection structure has a substantially uniform thickness and is substantially coplanar with the gate electrode.

12. The high voltage semiconductor device of claim 9, wherein one end of the insulating pattern is on an uppermost surface of the connection structure.

13. The high voltage semiconductor device of claim 12, wherein the floating gate has a substantially uniform thickness and is substantially coplanar with the gate electrode.

14. The high voltage semiconductor device of claim 12, wherein the floating gate has a substantially identical composition and a substantially identical height as the gate electrode.

15. The high voltage semiconductor device of claim 14, further comprising:

an insulating film between the floating gate and the substrate.

16. The high voltage semiconductor device of claim 15, comprising a plurality of the field plates, physically spaced apart from each other, on the insulating pattern.

17. The high voltage semiconductor device of claim 4, wherein the second plate has an opposite end on the second floating gate.

18. The high voltage semiconductor device of claim 17, wherein the conductive field plate further comprises a third plate spaced apart from the second plate and closer to the drain than is the second plate.

19. The high voltage semiconductor device of claim 18, wherein the opposite end of the second plate is on a first side of the second floating gate, and the one end of the third plate is on an opposite side of the second plate.

20. The high voltage semiconductor device of claim 9, wherein the gate electrode, the first floating gate, and the connection structure include conductive polysilicon, a metal, a conductive metal nitride, or a combination thereof.

* * * * *